(12) United States Patent
Kodato et al.

(10) Patent No.: US 7,750,741 B2
(45) Date of Patent: Jul. 6, 2010

(54) PLL CIRCUIT AND SEMICONDUCTOR DEVICE

(75) Inventors: Kenichi Kodato, Kawasaki (JP); Atsushi Matsuda, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 11/505,446

(22) Filed: Aug. 17, 2006

(65) Prior Publication Data

US 2007/0200637 A1 Aug. 30, 2007

(30) Foreign Application Priority Data

Feb. 22, 2006 (JP) ............................. 2006-045306

(51) Int. Cl.
*H03L 7/093* (2006.01)
(52) U.S. Cl. ...................... 331/17; 327/157; 327/558
(58) Field of Classification Search ............... 331/17, 331/16; 327/156, 157, 311, 344, 552, 558
See application file for complete search history.

(56) References Cited

U.S. PATENT DOCUMENTS

| | | | |
|---|---|---|---|
| 4,940,951 A * | 7/1990 | Sakamoto | 331/4 |
| 5,047,733 A * | 9/1991 | Nonaka et al. | 331/14 |
| 5,335,271 A * | 8/1994 | Takato et al. | 379/382 |
| 5,710,526 A * | 1/1998 | Nauta et al. | 331/25 |
| 5,783,971 A * | 7/1998 | Dekker | 331/17 |
| 6,606,364 B1 * | 8/2003 | Walley et al. | 375/376 |
| 6,885,244 B2 * | 4/2005 | Shor | 330/253 |
| 7,005,929 B2 * | 2/2006 | Smith | 331/17 |

* cited by examiner

*Primary Examiner*—Robert Pascal
*Assistant Examiner*—Levi Gannon
(74) *Attorney, Agent, or Firm*—Arent Fox LLP.

(57) ABSTRACT

A PLL circuit has a phase comparator to receive an input signal and a feedback signal, a charge pump controlled by an output of the phase comparator, a lowpass filter part to receive an output of the charge pump, a current controlled oscillator controlled by an output of the lowpass filter part, and a frequency divider to frequency-divide an output of the current controlled oscillator and to output the feedback signal. The lowpass filter part has an amplifier to receive the output of the charge pump and a reference voltage, and a circuit part including capacitors and resistors to receive the output of the charge pump and an output of the amplifier.

11 Claims, 12 Drawing Sheets

PLL CIRCUIT AND SEMICONDUCTOR DEVICE

BACKGROUND OF THE INVENTION

1. Field of the Invention

The present invention generally relates to phase locked loop (PLL) circuits and semiconductor devices, and more particularly to a PLL circuit that operates even at a relatively low power supply voltage and to a semiconductor device including such a PLL circuit.

2. Description of the Related Art

FIG. 1 is a diagram showing an example of a conventional PLL circuit. A PLL circuit 101 has a phase comparator 111 that receives an input signal and a feedback signal which will be described later, a charge pump 112 that is controlled by an output of the phase comparator 111, a lowpass filter (LPF) 113, a voltage controlled oscillator (VCO) 114, and a frequency divider 115. The LPF 113 is made up of a resistor R1 and capacitors C1 and C2. An output signal of the VCO 114 is subjected to a 1/N frequency-division by the frequency divider 115, and is fed back to the phase comparator 111 as the feedback signal referred above. In FIG. 1, VDD denotes a power supply voltage.

When designing the PLL circuit 101, measures are taken so as to sufficiently secure stability of the PLL circuit 101. In order to analyze the stability of the PLL circuit 101, an absolute value |Gop| of an open gain Gop of the PLL and a phase Φ of the PLL, obtained from the following formulas (1) through (3), are used. In the following formulas (1) through (3), Icp denotes the current flowing through the charge pump 112, S=jω (ω denotes the frequency), R1 denotes the resistance of the resistor R1, C1 and C2 respectively denote the capacitances of the capacitors C1 and C2, and $K_{VCO}$ denotes the gain of the VCO 114.

$$Gop=(Icp/2\pi) \times [(1+SR1C1)/\{S(C1+C2)(1+S(R1C1C2)/(C1+C2))\}] \times (2\pi \times K_{VCO})/S \quad (1)$$

$$|Gop|=(1/\omega^2) \times \{(Icp \times K_{VCO})/(C1+C2)\}\{(1+\omega^2 \cdot R1^2 C1^2)^{1/2}/1\} \times [1/\{1+\omega^2 \cdot (R1C1C2)^2/(C1+C2)^2\}^{1/2}] \quad (2)$$

$$\Phi=-\pi+\tan^{-1}(\omega \cdot R1C1)-\tan^{-1}\{\omega \cdot (R1C1C2)/(C1+C2)\} \quad (3)$$

FIG. 2 is a diagram showing a gain versus frequency characteristic of the formula (2), and FIG. 3 is a diagram showing a phase versus frequency characteristic of the formula (3). In FIG. 3, a difference between the phase at a crossover frequency where the open gain Gop becomes 0 and the phase of −180° is referred to as a phase margin. When designing the PLL circuit 101, the parameters of the PLL are determined so that this phase margin becomes 45°.

Due to the size reduction of semiconductor integrated circuits, the tendency is for the power supply voltage to becomes lower. For this reason, there is a tendency for the input voltage range of the VCO 114 within the PLL circuit 101 of the semiconductor integrated circuit to become narrower. Hence, when designing the VCOs 114 having the same performance, the tendency is for the gain $K_{VCO}$ of the VCO 114 to become larger as the input voltage range of the VCO 114 becomes narrower.

FIG. 4 is a diagram showing a relationship of the output frequency and the input voltage of the VCO 114. In FIG. 4, Vth denotes a threshold value of the input voltage of the VCO 114. The oscillation range of the VCO 114 is determined by the threshold voltage Vth and a power supply voltage VDDH of the VCO 114. For example, if the power supply voltage VDDH of the VCO 114 decreases to VDDL, the gain $K_{VCO}$ increases and becomes larger when designing the VCOs 114 in the same oscillation guarantee range. Since the gain $K_{VCO}$ appears in the numerator of the formula (2), the crossover frequency in FIG. 2 becomes high, and the phase margin in FIG. 3 consequently becomes small. Accordingly, when designing the VCOs 114 having the same performance, the capacitance of the capacitor C1 must be made large in order to reduce the crossover frequency by an amount corresponding to the increase of the gain $K_{VCO}$, but as a result, the area occupied by the capacitor C1 becomes large to thereby preventing the size reduction of the semiconductor integrated circuits.

Therefore, in the conventional PLL circuit, when the power supply voltage becomes low due to the size reduction of the semiconductor integrated circuit, it becomes necessary to increase the gain of the VCO to a large value. For this reason, there were problems in that the capacitance of the capacitor within the LPF increases by the amount corresponding to the increase of the gain of the VCO, and that the area occupied by the capacitor becomes large to thereby prevent the size reduction of the semiconductor integrated circuit. Furthermore, there was a problem in that the power consumption of the PLL circuit becomes large due to the large gain of the VCO.

SUMMARY OF THE INVENTION

Accordingly, it is a general object of the present invention to provide a novel and useful PLL circuit and semiconductor device, in which the problems described above are suppressed.

Another and more specific object of the present invention is to provide a PLL circuit and a semiconductor device, which can prevent the power consumption from becoming large, without interfering with the size reduction of the semiconductor integrated circuit, even if the power supply voltage is relatively low.

Still another object of the present invention is to provide a phase locked loop circuit comprising a phase comparator configured to receive an input signal and a feedback signal; a charge pump controlled by an output of the phase comparator; a lowpass filter part configured to receive an output of the charge pump; a current controlled oscillator controlled by an output of the lowpass filter part; and a frequency divider configured to frequency-divide an output of the current controlled oscillator and to output the feedback signal, the lowpass filter part comprising an amplifier configured to receive the output of the charge pump and a reference voltage; and a circuit part, including capacitors and resistors, configured to receive the output of the charge pump and an output of the amplifier. According to the phase locked loop circuit of the present invention, it is possible prevent the power consumption from becoming large, without interfering with the size reduction of the semiconductor integrated circuit which includes the phase locked loop circuit, even if the power supply voltage is relatively low.

A further object of the present invention is to provide a semiconductor device comprising a phase locked loop circuit, the phase locked loop circuit comprising a phase comparator configured to receive an input signal and a feedback signal; a charge pump controlled by an output of the phase comparator; a lowpass filter part configured to receive an output of the charge pump; a current controlled oscillator controlled by an output of the lowpass filter part; and a frequency divider configured to frequency-divide an output of the current controlled oscillator and to output the feedback signal, the lowpass filter part comprising an amplifier configured to receive the output of the charge pump and a reference voltage; and a circuit part, including capacitors and resistors, configured to receive the output of the charge pump and an output of the amplifier. According to the semiconductor device of the present invention, it is possible to prevent the power consumption from becoming large, without interfering with the size reduction of the semiconductor integrated circuit which includes the phase locked loop circuit, even if the power supply voltage is relatively low.

Other objects and further features of the present invention will be apparent from the following detailed description when read in conjunction with the accompanying drawings.

DESCRIPTION OF THE PREFERRED EMBODIMENTS

In the present invention, a LPF part including an amplifier, and a current controlled oscillator (CCO), are used in place of the PLL and the VCO that form the conventional PLL circuit. Hence, an apparent gain of the VCO, that is, the gain of the CCO, becomes smaller than the gain of the VCO of the conventional PLL circuit, and it is possible to prevent the power consumption from becoming large without interfering with the size reduction of the semiconductor integrated circuit.

A description will now be given of embodiments of the PLL circuit and the semiconductor device according to the present invention, by referring to FIG. 5 and the subsequent drawings.

Figure 5:
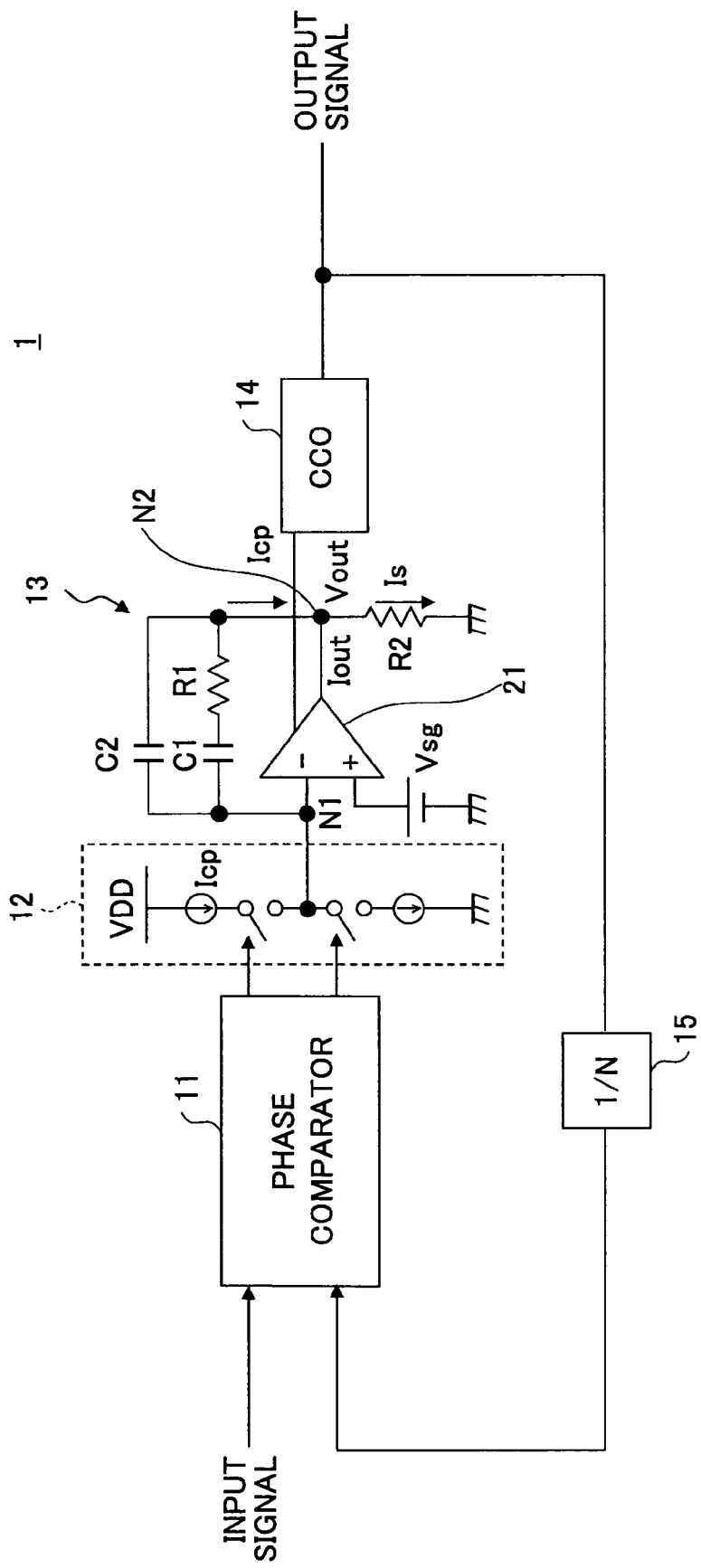
FIG. 5 is a diagram showing an embodiment of a PLL circuit according to the present invention.

FIG. 5 is a diagram showing an embodiment of the PLL circuit according to the present invention. A PLL circuit 1 has a phase comparator 11 that receives an input signal and a feedback signal which will be described later, a charge pump 12 that is controlled by an output of the phase comparator 11, a lowpass filter (LPF) part 13, a current controlled oscillator (CCO) 14, and a frequency divider 15. The LPF part 13 is made up of a circuit part including resistors R1 and R2, capacitors C1 and C2, and an amplifier 21, that are connected as shown in FIG. 5. A node N1 connecting the charge pump 12 and the capacitors C1 and C2 is connected to an inverting input terminal of the amplifier 21. The resistor R2 is connected between a node N2 and the ground. On the other hand, a reference voltage Vsg is input to a non-inverting input terminal of the amplifier 21. In other words, the amplifier 21 of this embodiment is formed by a differential amplifier. An output signal of the CCO 14 is subjected to a 1/N frequency division by the frequency divider 15, and is fed back to the phase comparator 11 as the feedback signal referred above. In FIG. 5, VDD denotes a power supply voltage.

For example, the PLL circuit 1 is provided within a semiconductor integrated circuit (not shown). Hence, the PLL circuit 1 may be accommodated in its entirety within a semiconductor device or, a semiconductor chip, that includes the semiconductor integrated circuit.

When designing the PLL circuit 1, measures are taken so as to sufficiently secure stability of the PLL circuit 1. In order to analyze the stability of the PLL circuit 1, an open gain Gop of the PLL is obtained from the following formulas (4) through (8), and an absolute value |Gop| of the open gain Gop of the PLL and a phase Φ of the PLL are used. In the following formulas (4) through (8), Icp denotes the current flowing through the charge pump 12, $S=j\omega$ ($\omega$ denotes the frequency), R1 and R2 respectively denote the resistances of the resistors R1 and R2, C1 and C2 respectively denote the capacitances of the capacitors C1 and C2, Iout denotes the output current of the amplifier 21, Vout denotes the output voltage of the amplifier 21 at the node N2 connecting the amplifier 21 and the resistor R2, and $K_{CCO}$ denotes the gain of the CCO 14. Since the method of obtaining the phase Φ of the PLL is not directly related to the subject matter of the present invention, a description thereof will be omitted.

$$Is = Iout + Icp \quad (4)$$

$$Vsg - Vout = [(1+SR1C1)/\{S(C1+C2)(1+S(R1C1C2)/(C1+C2))\}]Icp \quad (5)$$

$$Vout = R2 \times Is \quad (6)$$

$$Iout = (Vsg/R2) - [R2 + (1+SR1C1)/\{S(C1+C2)(1+S(R1C1C2)/(C1+C2))\}] \times (Icp/R2) \quad (7)$$

$$Gop = (1/2\pi) \times Iout \times 2\pi \times (K_{CCO}/S) \quad (8)$$

Accordingly, in this embodiment, it is possible to control the oscillation frequency by the current. For this reason, the input voltage range of the CCO 14 becomes wide, and the gain $K_{CCO}$ of the CCO 14 can be made small. Consequently, the apparent gain of the VCO of the conventional PLL circuit 101, that is, the gain $K_{CCO}$ of the CCO 14, becomes smaller than the gain $K_{VCO}$ of the VCO of the conventional PLL circuit 101 shown in FIG. 1, and the power consumption can be prevented from becoming large without interfering with the size reduction of the semiconductor integrated circuit in which the PLL circuit 1 is provided.

Figure 6:
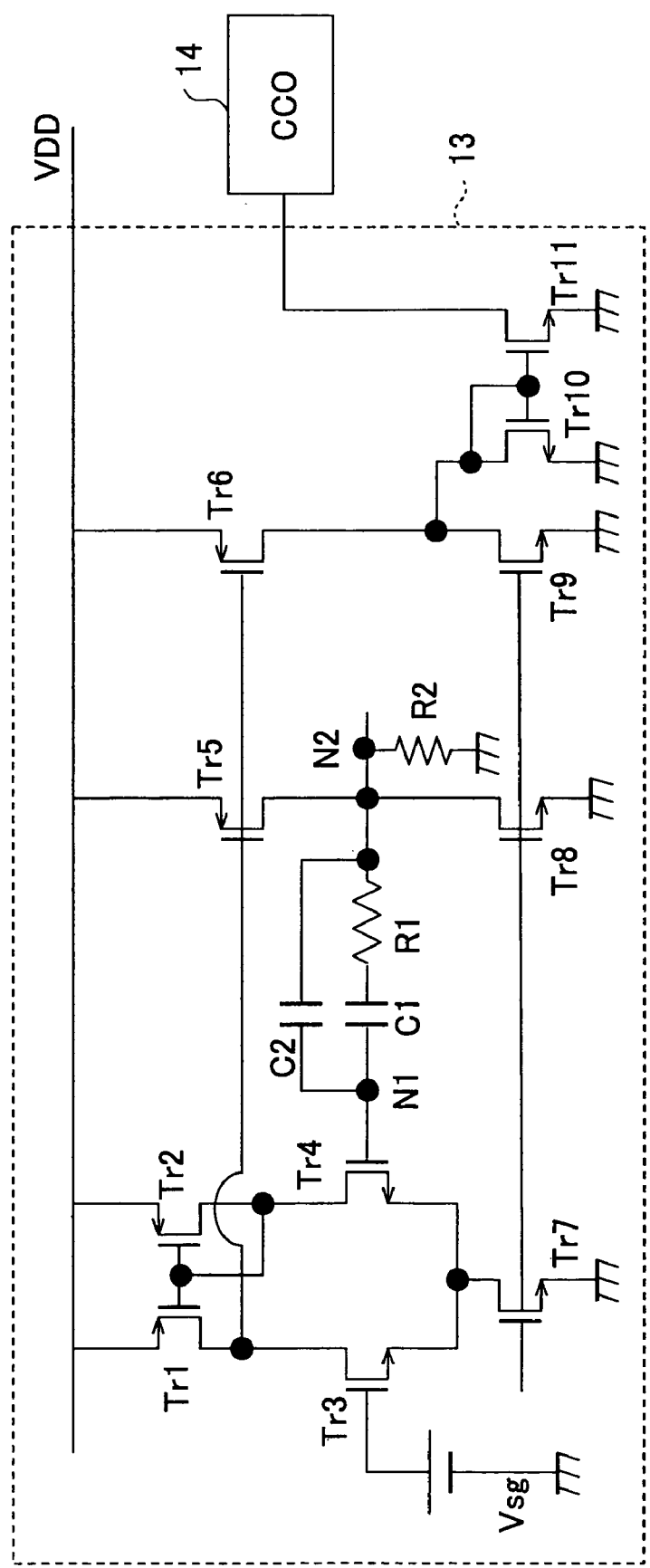
FIG. 6 is a circuit diagram showing an example of a structure of a lowpass filter part.

FIG. 6 is a circuit diagram showing an example of a structure of LPF part 13. The LPF part 13 includes transistors Tr1 through Tr11 that are connected as shown in FIG. 6, in addition to the resistors R1 and R2 and the capacitors C1 and C2 shown in FIG. 5. The output of the charge pump 12 is input to the node N1. In addition, the output voltage Vout is obtained from the node N2.

Figure 7:
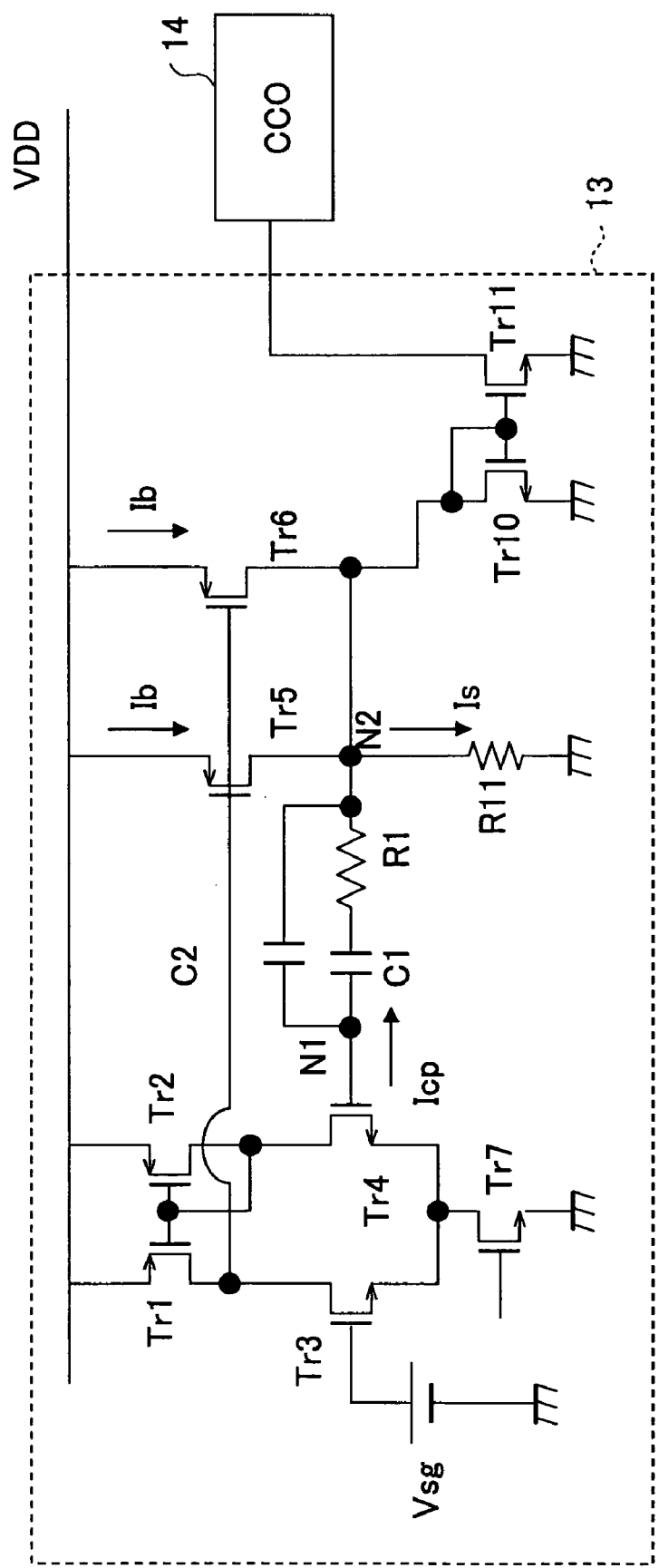
FIG. 7 is a circuit diagram showing another example of the structure of the lowpass filter part.

FIG. 7 is a circuit diagram showing another example of the structure of the LPF part 13. In FIG. 7, those parts that are the same as those corresponding parts in FIG. 6 are designated by the same reference numerals, and a description thereof will be omitted. In FIG. 7, a resistor R11 is provided in place of the resistor R2 and the transistors Tr8 and Tr9 shown in FIG. 6. In this case, the following formulas (9) through (13) stand in place of the formulas (4) through (8) described above. In the following formulas (10), (12) and (13), Ib denotes a current flowing through the transistors Tr5 and Tr6.

$$Vsg-Vout=Icp[(1+Sr1C1)/\{S(C1+C2)(1+S(R1C1C2)/(C1+C2))\}] \quad (9)$$

$$Ib=Is-Icp \quad (10)$$

$$Is=Vout/R2 \quad (11)$$

$$Ib=(1/R2)[Vsg-\{(1+SR1C1)/S(C1+C2)(1+S(R1C1C2)/(C1+C2))\}Icp]-Icp \quad (12)$$

$$Ib=(Vsg/R2)-[R2+\{(1+SR1C1)/S(C1+C2)(1+S(R1C1C2)/(C1+C2))\}]\times(Icp/R2) \quad (13)$$

Accordingly, when the LPF part 13 having the structure shown in FIG. 7 is used, it is also possible to control the oscillation frequency by the current, similarly to the case where the LPF part 13 having the structure shown in FIG. 6 is used. For this reason, the input voltage range of the CCO 14 becomes wide, and the gain $K_{CCO}$ of the CCO 14 can be made small. Consequently, the apparent gain of the VCO of the conventional PLL circuit 101, that is, the gain $K_{CCO}$ of the CCO 14, becomes smaller than the gain $K_{VCO}$ of the VCO of the conventional PLL circuit 101 shown in FIG. 1, and the power consumption can be prevented from becoming large without interfering with the size reduction of the semiconductor integrated circuit in which the PLL circuit 1 is provided.

Figure 1:
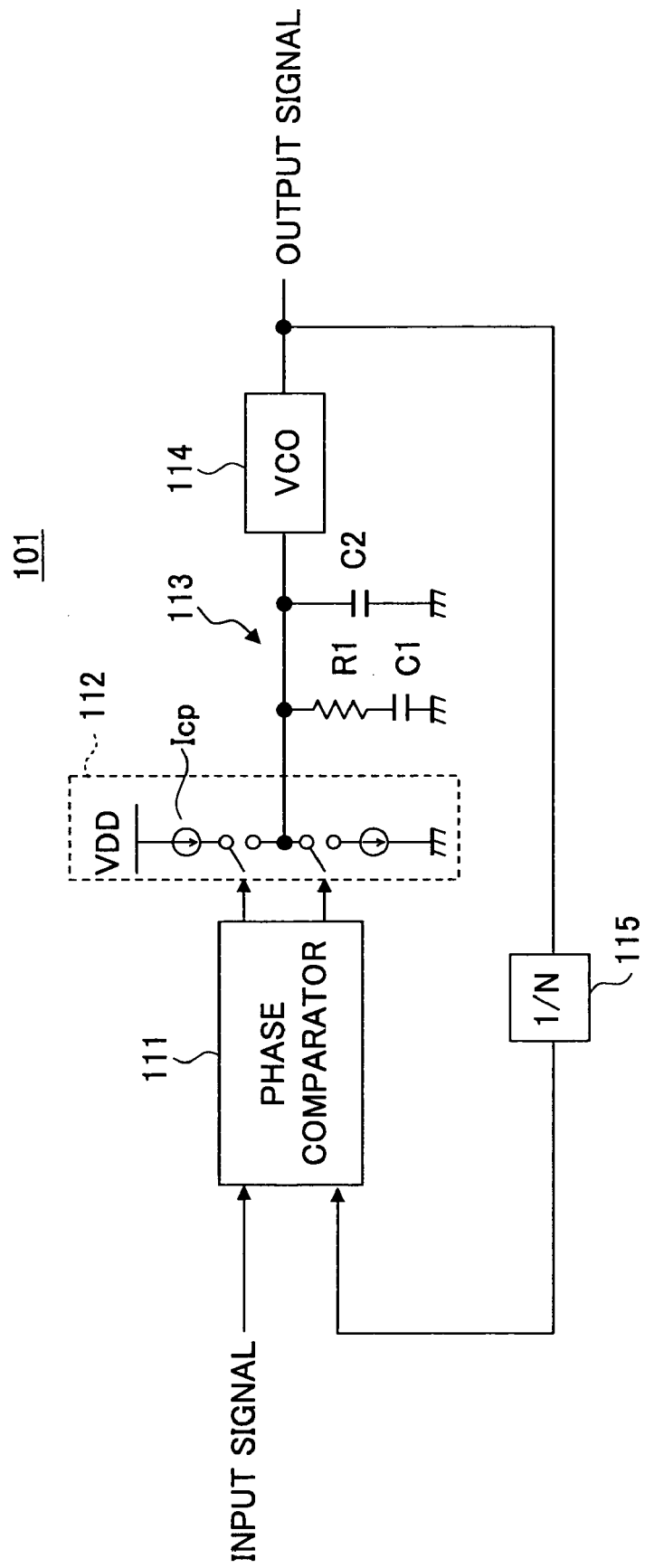
FIG. 1 is a diagram showing an example of a conventional PLL circuit.
Figure 2:
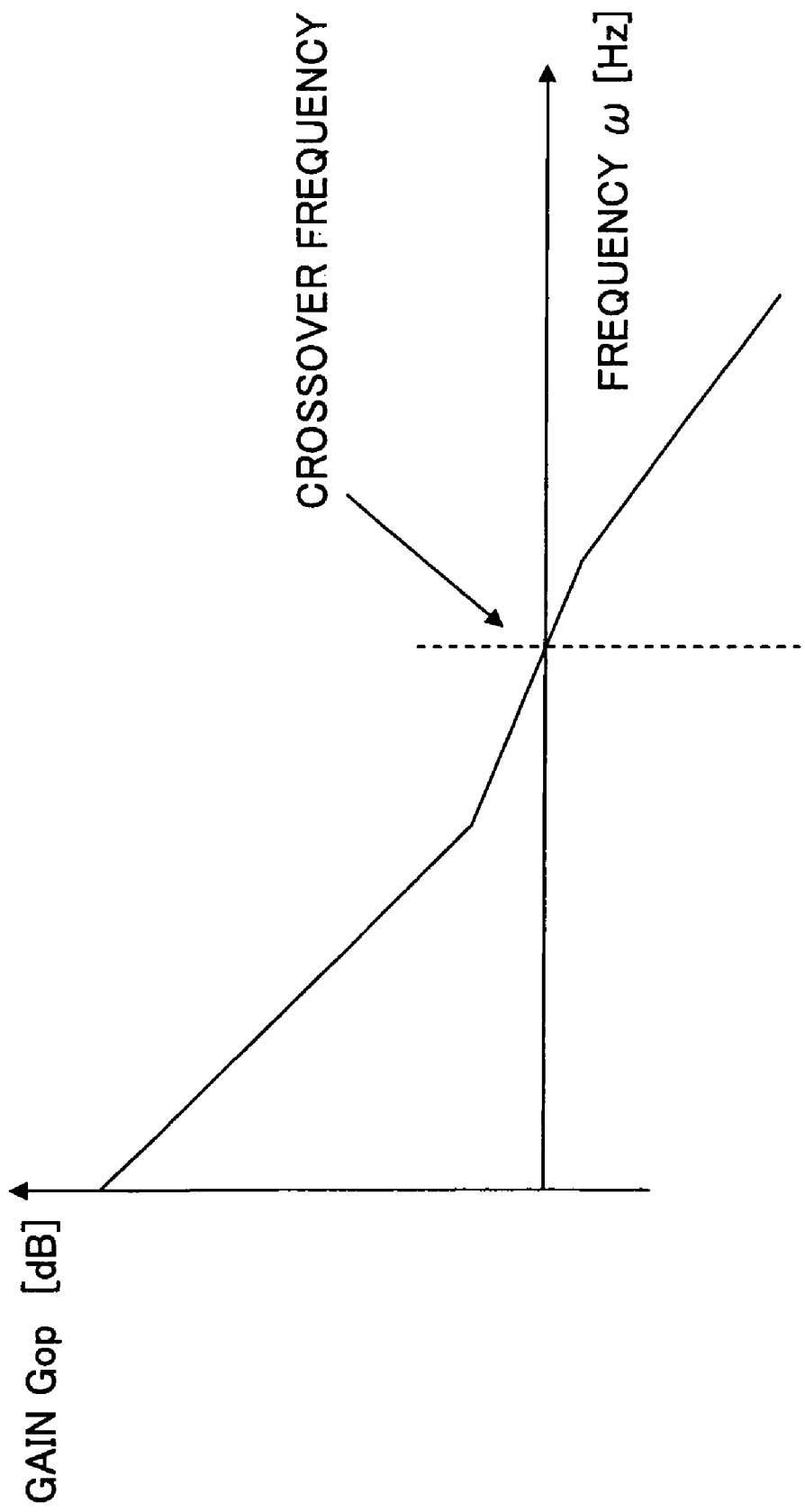
FIG. 2 is a diagram showing a gain versus frequency characteristic of a formula (2)
Figure 3:
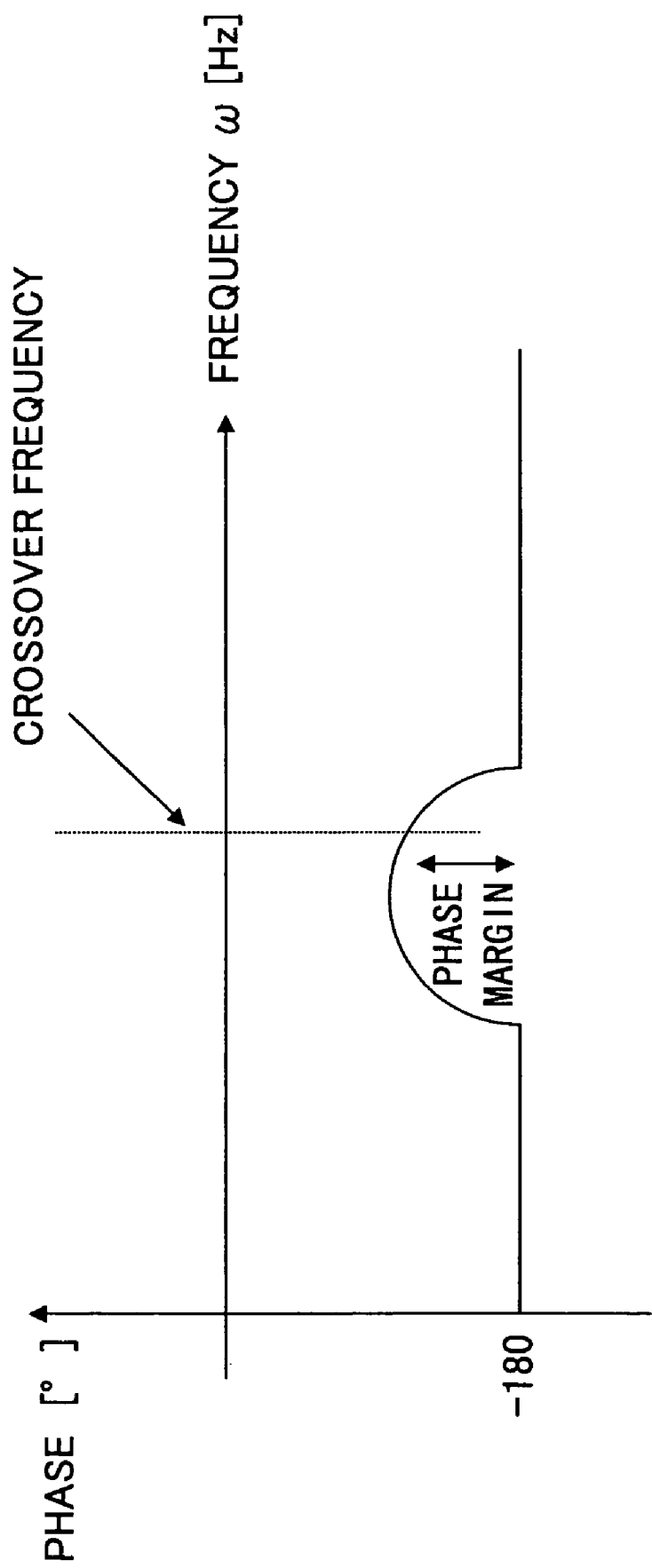
FIG. 3 is a diagram showing a phase versus frequency characteristic of a formula (3)
Figure 4:
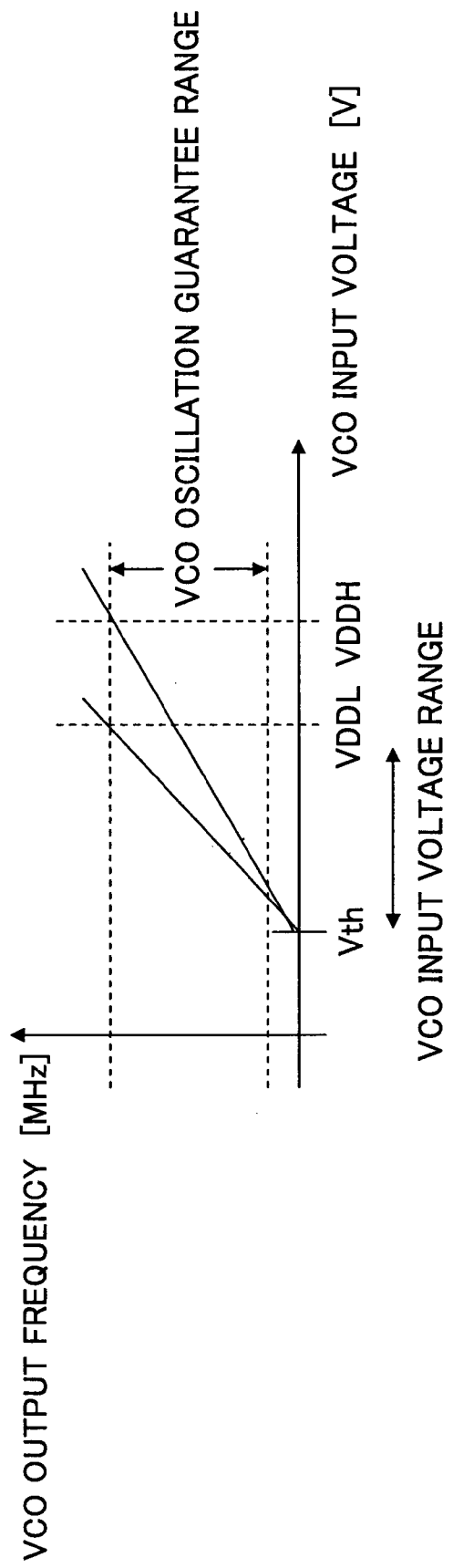
FIG. 4 is a diagram showing a relationship of an output frequency and an input voltage of a voltage controlled oscillator.
Figure 8:
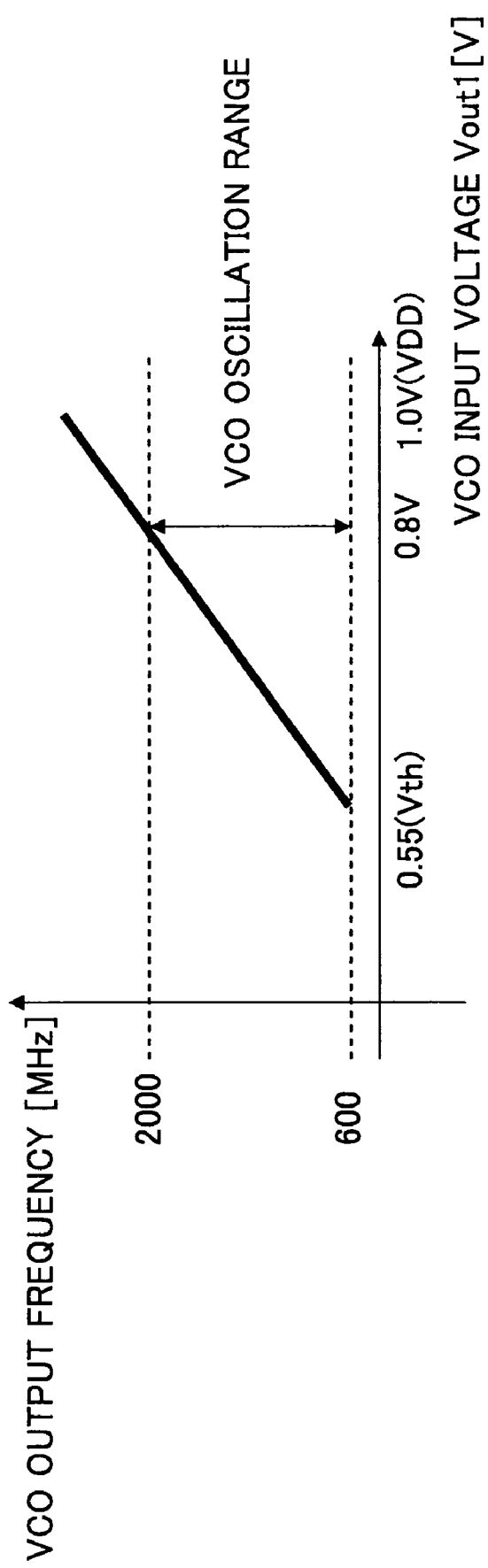
FIG. 8 is a diagram for explaining a gain at a PLL output stage of the conventional PLL circuit.
Figure 9:
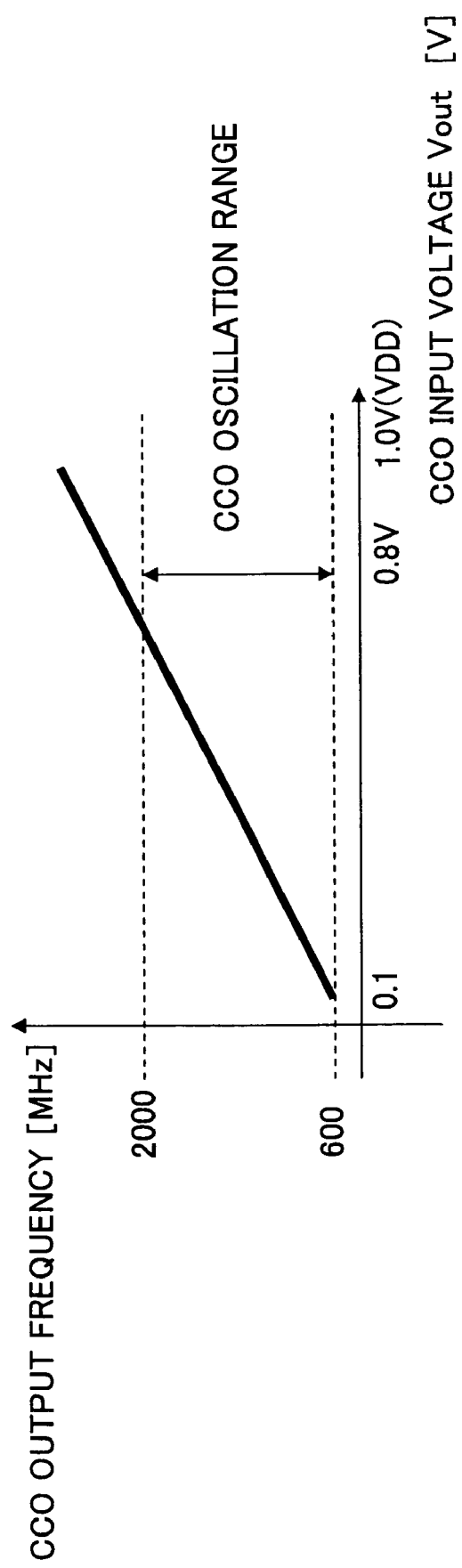
FIG. 9 is a diagram for explaining a gain at a PLL output stage of the PLL circuit of the embodiment.

FIG. 8 is a diagram for explaining a gain at a PLL output stage of the conventional PLL circuit 101 shown in FIG. 1. In FIG. 8, the ordinate indicates the output frequency of the VCO 114, and the abscissa indicates the input voltage Vout1 of the VCO 114 (that is, the output voltage of the LPF 113). In addition, FIG. 9 is a diagram for explaining a gain at a PLL output stage of the PLL circuit 1 of this embodiment shown in FIG. 5. In FIG. 9, the ordinate indicates the output frequency of the CCO 14, and the abscissa indicates the input voltage Vout of the CCO 14 (that is, the output voltage of the LPF part 13 at the node N2). FIGS. 8 and 9 show examples of the numerical values for the case where the capacitances of the capacitors C1 and C2 show in FIG. 1 are approximately the same as the capacitances of the corresponding capacitors C1 and C2 shown in FIG. 5.

The input voltage Vout of the CCO 14 can be obtained from the following formula (14).

$$Vout=Vsg-Icp[(1+SR1C1)/\{S(C1+C2)(1+S(R1C1C2)/(C1+C2))\} \quad (14)$$

In the conventional case shown in FIG. 8, the gain at the PLL output stage, that is, the gain $K_{VCO}$ of the VCO 114, becomes $K_{VCO}$=(2000−600)/(0.8−0.55)=5600 MHz/V=5.6 GHz/V.

On the other hand, in the case of the embodiment shown in FIG. 9, the gain at the PLL output stage, that is, the gain $K_{CCO}$ of the CCO 14, becomes $K_{CCO}$=(2000−600)/(0.8−0.1)=2000 MHz/V=2 GHz/V. Hence, when converted into voltage versus oscillation frequency, it may be seen that the gain at the PLL output stage can be reduced to approximately ⅓ that of the conventional case.

Figure 10:
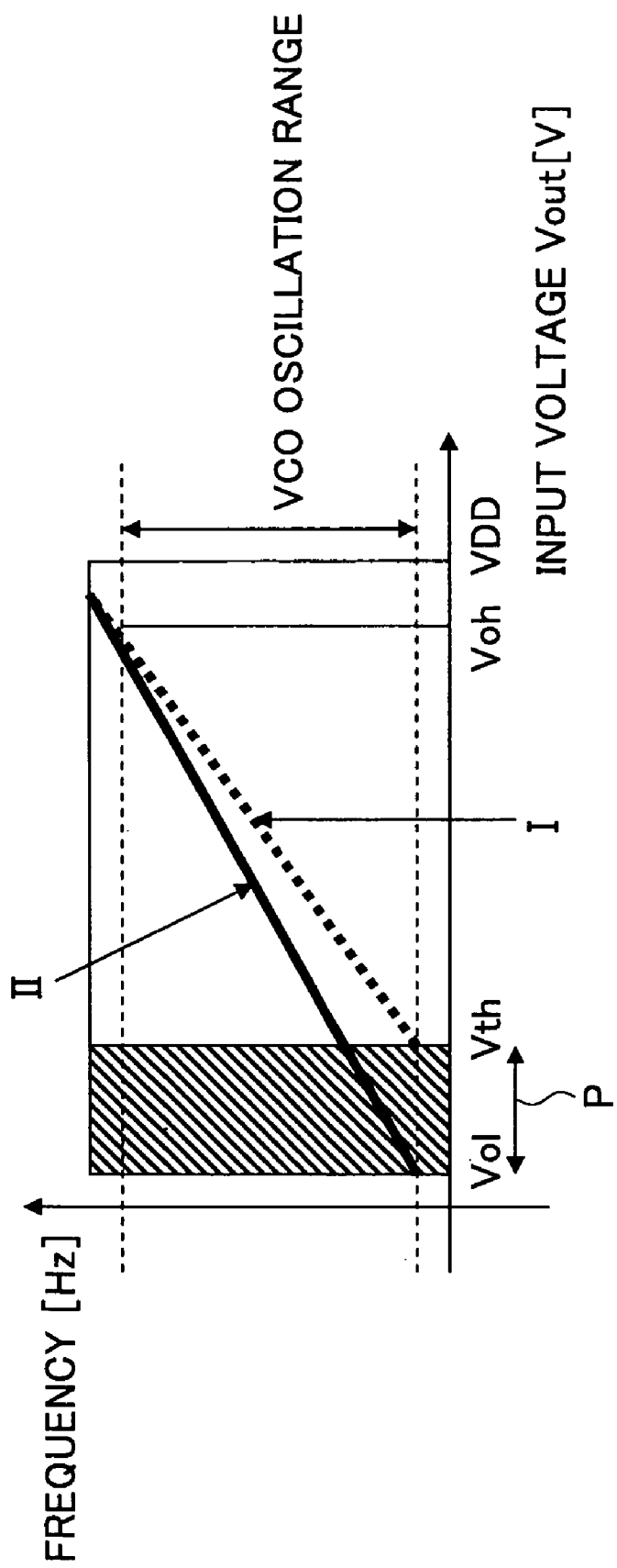
FIG. 10 is a diagram comparing the gains at the PLL output stages of the conventional PLL circuit and the PLL circuit of the embodiment.

FIG. 10 is a diagram comparing the gains at the PLL output stages of the conventional PLL circuit 101 shown in FIG. 1 and the PLL circuit 1 of this embodiment shown in FIG. 5. FIG. 10 is substantially the same as overlapping FIGS. 8 and 9 described above. In FIG. 10, a dotted line I indicates the characteristic of the conventional PLL circuit 101, and a solid line II indicates the characteristic of the PLL circuit 1 of this embodiment. In addition, Vth denotes the threshold value of the input voltage of the VCO 114 of the conventional PLL circuit 101, and Vol and Voh respectively denote a lower limit and an upper limit of the input voltage range of the CCO 14 of the PLL circuit 1 of this embodiment. For the sake of convenience, the oscillation range of the VCO 114 and the oscillation range of the CCO 14 will both be referred to as the VCO oscillation range. As shown in FIG. 10, the VCO oscillation range of the conventional PLL circuit 101 is determined by the threshold voltage Vth and the power supply voltage VDD, while the VCO oscillation range of the PLL circuit 1 of this embodiment is determined by the minimum input voltage Vol of the amplifier 21 and the power supply voltage VDD.

As may be seen from FIG. 10, the input voltage range of this embodiment is widened by a range P from Vol to Vth, when compared to the input voltage range of the conventional PLL circuit 101. As a result, the minimum input voltage Vol of the amplifier 21 becomes sufficiently lower than the threshold voltage Vth, and the apparent gain of the VCO of the conventional PLL circuit 101, that is, the gain $K_{CCO}$ of the CCO 14, becomes smaller than the gain $K_{VCO}$ of the VCO of the conventional PLL circuit 101 shown in FIG. 1, and the power consumption can be prevented from becoming large without interfering with the size reduction of the semiconductor integrated circuit in which the PLL circuit 1 is provided.

Figure 11:
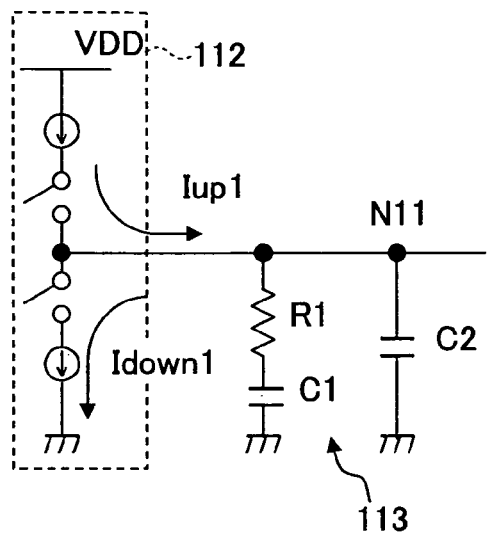
FIG. 11 is a diagram for explaining a flow of current in a charge pump of the conventional PLL circuit.

FIG. 11 is a diagram for explaining a flow of current in the charge pump 112 of the conventional PLL circuit 101 shown in FIG. 1. In the conventional PLL circuit 101, a steady phase error is generated due to the unbalance of a current Iup1 flowing from the charge pump 112 to the node N11 and a current Idown1 flowing from the node N11 to the charge pump 112. In an ideal state, the PLL operates so that the clock edge delay is 0 between the input to the phase comparator 111 and the feedback input to the phase comparator 111. But when the currents Iup1 and Idown1 become unbalanced, the PLL becomes locked at a timing when the clock edge delay is not 0. The steady phase error refers to this locking of the PLL at the timing when the clock edge delay is not 0.

Figure 12:
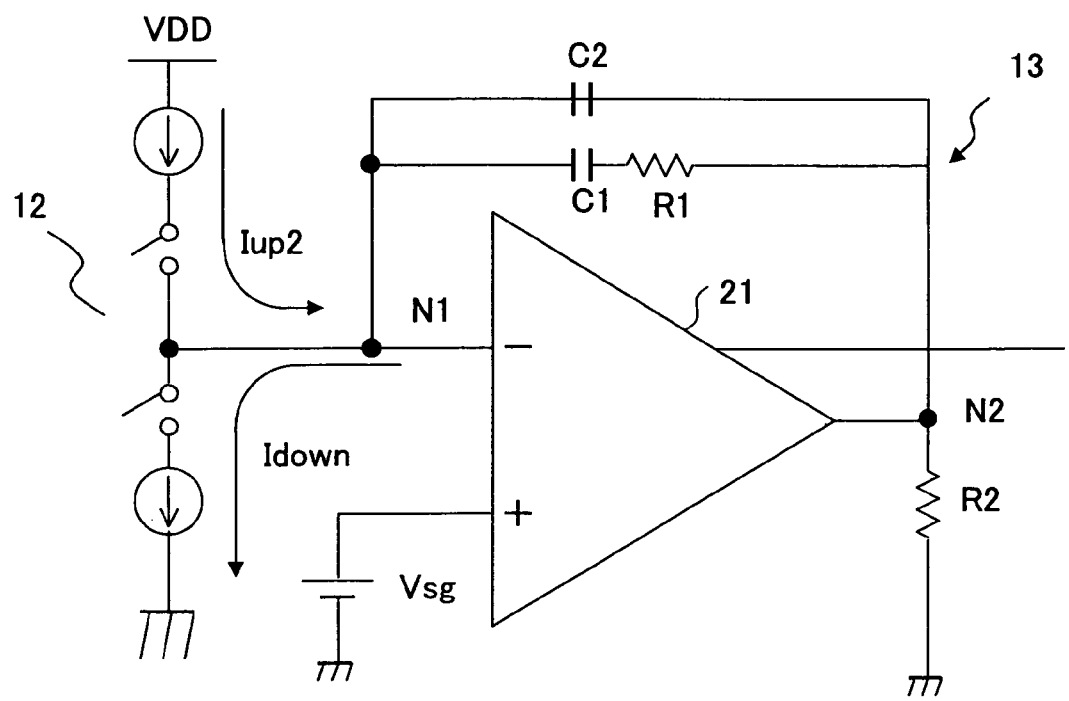
FIG. 12 is a diagram for explaining a flow of a current in a charge pump of PLL circuit of the embodiment.

FIG. 12 is a diagram for explaining a flow of a current in the charge pump 12 of the PLL circuit 1 of this embodiment. In this embodiment, if the reference voltage Vsg that is input to the non-inverting input terminal of the amplifier 21 is constant, the voltage input to the inverting input terminal of the amplifier 21 is also maintained constant. For this reason, in this embodiment, a current Iup flowing from the charge pump 12 to the node N1 is maintained the same as a current Idown flowing from the node N1 to the charge pump 12, to thereby prevent the generation of the steady phase error described above.

Figure 13:
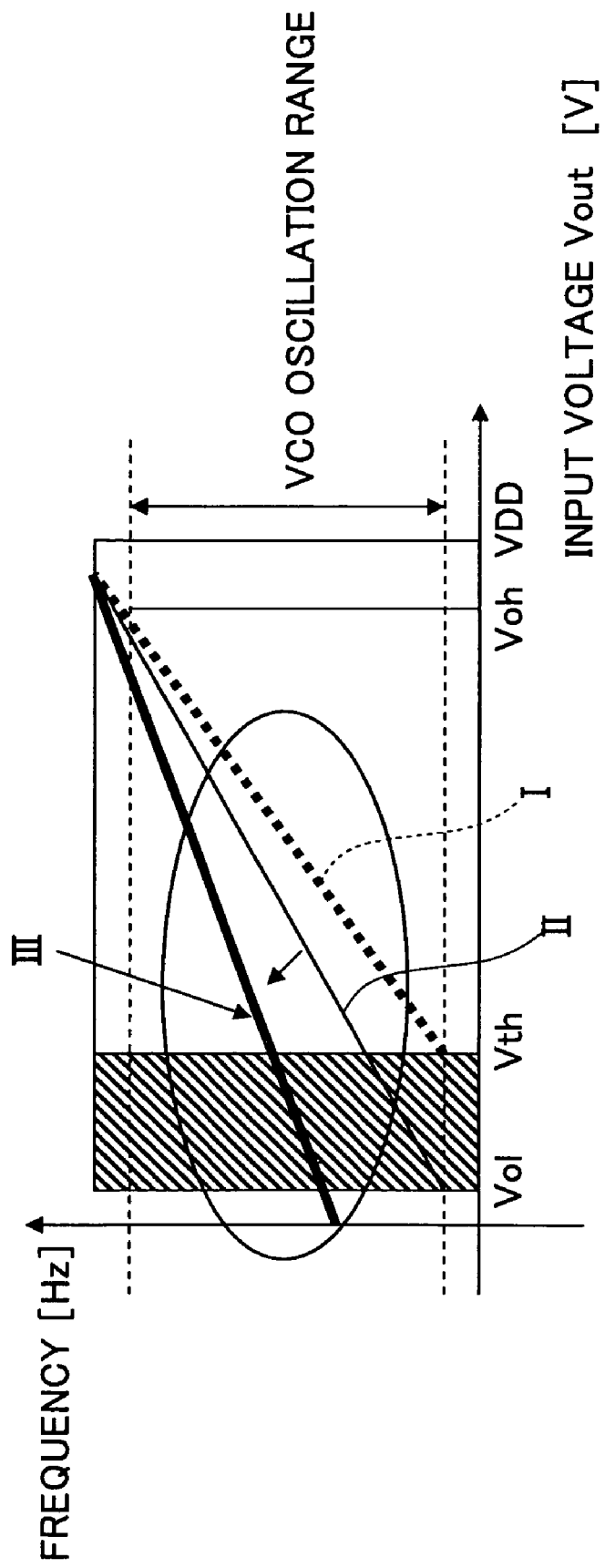
FIG. 13 is a diagram for explaining reasons why a further decrease of the gain at the PLL output stage of the PLL circuit is possible in the embodiment.

FIG. 13 is a diagram for explaining reasons why a further decrease of the gain at the PLL output stage of the PLL circuit 1 is possible in this embodiment. In FIG. 13, those parts that are the same as those shown in FIG. 10 are designated by the same reference numerals and a description thereof will be omitted.

By changing the size of the transistor Tr9 within the LPF part 13 shown in FIG. 6, it is possible take measures so that a current larger than 0 flows to the CCO 14 even if the output voltage Vout of the LPF part 13 becomes 0. In this case, since it is possible to provide an intercept as shown by a characteristic III indicated by a bold line in FIG. 13, the gain $K_{CCO}$ of the CCO 13 can further be reduced to a small value.

This application claims the benefit of a Japanese Patent Application No. 2006-045306 filed Feb. 22, 2006, in the Japanese Patent Office, the disclosure of which is hereby incorporated by reference.

Further, the present invention is not limited to these embodiments, but various variations and modifications may be made without departing from the scope of the present invention.

What is claimed is:

1. A phase locked loop circuit comprising:
   a phase comparator configured to receive an input signal and a feedback signal;
   a charge pump controlled by an output of the phase comparator;
   a lowpass filter part configured to receive an output of the charge pump;
   a current controlled oscillator controlled by a current output from the lowpass filter part; and
   a frequency divider configured to frequency-divide an output of the current controlled oscillator and to output the feedback signal,
   said lowpass filter part comprising:
      an amplifier part including an amplifier having an inverting input terminal and a non-inverting input terminal, and configured to receive the output of the charge pump by the inverting input terminal and a reference voltage by the non-inverting input terminal; and
      a circuit part configured to receive the output of the charge pump and an output of the amplifier,
      said circuit part including first and second capacitors having first terminals coupled to a first node that couples the output of the charge pump and the inverting input terminal of the amplifier, and first and second resistors having first terminals coupled to a second node that couples to the output of the amplifier, wherein the first resistor has a second terminal coupled to a second terminal of the first capacitor, the second capacitor has a second terminal coupled to the second node, and the second resistor has a second terminal that is grounded,
      said amplifier part further including a current mirror circuit coupled to the output of the amplifier and configured to supply a current which is larger than 0 and is output from the lowpass filter part to the current controlled oscillator,
   wherein a current flowing from the charge pump to the first node and a current flowing from the first node to the charge pump are maintained the same.

2. The phase locked loop circuit as claimed in claim 1, wherein an output voltage Vout of the amplifier at the second node is represented by $$Vout = Vsg - Icp[(1 + SR1C1)/\{S(C1+C2)(1+S(R1C1C2)/(C1+C2))\}]$$

where Vsg denotes the reference voltage, Icp denotes a current flowing through the charge pump, C1 and C2 respectively denote capacitances of the first and second capacitors, R1 and R2 respectively denote resistances of the first and second resistors, $S=j\omega$ and $\omega$ denotes frequency.

3. The phase locked loop circuit as claimed in claim 2, wherein the current mirror circuit supplies the current which is larger than 0 and is output from the lowpass filter part to the current controlled oscillator even when the output voltage Vout of the amplifier becomes 0.

4. The phase locked loop circuit as claimed in claim 1, wherein the current mirror circuit supplies the current which is larger than 0 and is output from the lowpass filter part to the current controlled oscillator even when the output of the amplifier becomes 0.

5. The phase locked loop circuit as claimed in claim 1, wherein an oscillation range of the current controlled oscillator is determined by a minimum input voltage of the amplifier and a power supply voltage.

6. The phase locked loop circuit as claimed in claim 1, wherein the current mirror circuit includes:
   a first transistor and a second transistor coupled in series via a third node, between a power supply voltage and ground;
   a third transistor having a base and a drain coupled in common to the third node, and a source coupled to the ground; and
   a fourth transistor having a base coupled to third node, a drain coupled to an input of the current controlled oscillator, and a source coupled to the ground.

7. A semiconductor device comprising:
   a phase locked loop circuit,
   said phase locked loop circuit comprising:
      a phase comparator configured to receive an input signal and a feedback signal;
      a charge pump controlled by an output of the phase comparator;
      a lowpass filter part configured to receive an output of the charge pump;
      a current controlled oscillator controlled by a current output from the lowpass filter part; and
      a frequency divider configured to frequency-divide an output of the current controlled oscillator and to output the feedback signal,
      said lowpass filter part comprising:
         an amplifier part including an amplifier having an inverting input terminal and a non-inverting input terminal, and configured to receive the output of the charge pump by the inverting input terminal and a reference voltage by the non-inverting input terminal; and
         a circuit part configured to receive the output of the charge pump and an output of the amplifier,
         said circuit part including first and second capacitors having first terminals coupled to a first node that couples the output of the charge pump and the inverting input terminal of the amplifier, and first and second resistors having first terminals coupled to a second node that couples to the output of the amplifier, wherein the first resistor has a second terminal coupled to a second terminal of the first capacitor, the second capacitor has a second terminal coupled to the second node, and the second resistor has a second terminal that is grounded,
         said amplifier part further including a current mirror circuit coupled to the output of the amplifier and configured to supply a current which is larger than 0 and is output from the lowpass filter part to the current controlled oscillator,
      wherein a current flowing from the charge pump to the first node and a current flowing from the first node to the charge pump are maintained the same.

8. The semiconductor device as claimed in claim 7, wherein an output voltage Vout of the amplifier at the second node is represented by $$Vout = Vsg - Icp[(1 + SR1C1)/\{S(C1+C2)(1+S(R1C1C2)/(C1+C2))\}]$$

where Vsg denotes the reference voltage, Icp denotes a current flowing through the charge pump, C1 and C2 respectively denote capacitances of the first and second capacitors, R1 and R2 respectively denote resistances of the first and second resistors, $S=j\omega$ and $\omega$ denotes frequency.

9. The semiconductor device as claimed in claim 7, wherein the current mirror circuit supplies the current which is larger than 0 and is output from the lowpass filter part to the current controlled oscillator even when the output of the amplifier becomes 0.

10. The semiconductor device as claimed in claim 7, wherein an oscillation range of the current controlled oscillator is determined by a minimum input voltage of the amplifier and a power supply voltage.

11. The semiconductor device as claimed in claim 7, wherein the current mirror circuit includes:
   a first transistor and a second transistor coupled in series via a third node, between a power supply voltage and ground;
   a third transistor having a base and a drain coupled in common to the third node, and a source coupled to the ground; and
   a fourth transistor having a base coupled to third node, a drain coupled to an input of the current controlled oscillator, and a source coupled to the ground.

* * * * *